United States Patent [19]

Kessels

[11] Patent Number: 4,779,008
[45] Date of Patent: Oct. 18, 1988

[54] MULTIPLE REDUNDANT CLOCK SYSTEM COMPRISING A NUMBER OF MUTUALLY SYNCHRONIZING CLOCKS, AND CLOCK CIRCUIT FOR USE IN SUCH A CLOCK SYSTEM

[75] Inventor: Jozef L. W. Kessels, Eindhoven, Netherlands

[73] Assignee: U.S. Philips Corporation, New York, N.Y.

[21] Appl. No.: 63,542

[22] Filed: Jun. 17, 1987

Related U.S. Application Data

[63] Continuation of Ser. No. 540,468, Oct. 11, 1983, abandoned.

[30] Foreign Application Priority Data

Oct. 11, 1982 [NL] Netherlands ................. 8203921

[51] Int. Cl.$^4$ ..................... H03K 5/13; H01J 19/82
[52] U.S. Cl. ..................... 307/269; 307/219; 328/72; 331/1 A; 331/55
[58] Field of Search ............ 307/269, 480, 529, 219, 307/262, 518; 328/63, 72, 104, 133, 155; 331/1 A, 2, 55, 56, 172

[56] References Cited

U.S. PATENT DOCUMENTS 4,223,392  9/1980  Lemaire et al. ............... 307/269
4,239,982 12/1980  Smith et al. .................. 307/219
4,419,629 12/1983  O'Brien ....................... 307/269
4,538,110  8/1985  Hollaar et al. ................ 307/269

Primary Examiner—Stanley D. Miller
Assistant Examiner—Timothy P. Callahan
Attorney, Agent, or Firm—William J. Streeter; Jack E. Haken; Anne E. Barschall

[57] ABSTRACT

A multiple redundant clock system comprises at least n=4 clocks and is self-synchronizing and fault tolerant against the failure of at the most $\frac{1}{2}(n-1)$ clocks. Each clock comprises an oscillator circuit which activates a dividing circuit at the end of each period in order to form its own clock signal on the output of the dividing circuit. Each clock furthermore comprises a deviation-determining device which compares the own clock signal with the clock signals originating from the other clocks in the system. When an excessively large number of the other clock signals deviate during the first half of the (own) period, the own oscillator circuit is decelerated. When an excessively large number of the other clock signals deviate during the second half of the own period, the own oscillator circuit is accelerated.

11 Claims, 3 Drawing Sheets

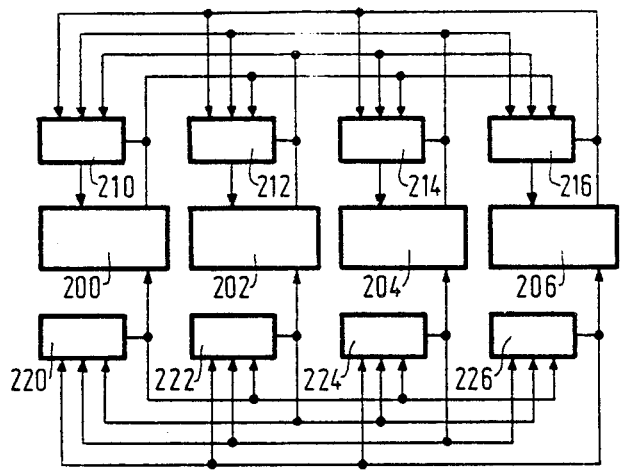
FIG.1
```
do   D(s)>F and  p<N/2 →skip
[]   D(s)≤F and  p<N →p:=p+1
[]   D(s)>F and  p≥N/2 or p=N→S:=S̄;p:=0
od
```
FIG.3
```
do   S≠V and  p<N/2→skip
[]   S=V and  p<N→p:=p+1
[]   S≠V and  p≥N/2 or p=N →S:=S̄;p:=0
od
```
FIG.4
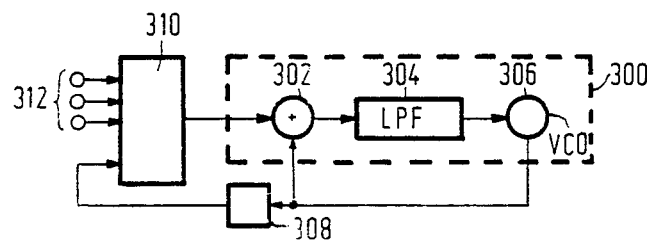
FIG.5

MULTIPLE REDUNDANT CLOCK SYSTEM COMPRISING A NUMBER OF MUTUALLY SYNCHRONIZING CLOCKS, AND CLOCK CIRCUIT FOR USE IN SUCH A CLOCK SYSTEM

This is a continuation of application Ser. No. 540,468 filed Oct. 11, 1983.

BACKGROUND OF THE INVENTION

The invention relates to a multiple redundant clock system, comprising a number of $n \geq 4$ mutually synchronizing clocks, each of which comprises a respective clock output for a bivalent clock signal, system comprising an interconnection network for applying the clock signal of each clock to each of the other clocks, each clock comprising an oscillator circuit and a deviation-determining device to an input of which the oscillator circuit is connected via an interconnection and which comprises further inputs for receiving the clock signals of the other clocks. A clock system of this kind is known from U.S. Pat. No. 4,239,982 to T. Basil Smith et al. which is incorporated herein by way of reference. Such a clock system is used, for example, in a digital device which is composed of a number of stations which must operate in synchronism, for example in a multiprocessor computer system in which each processor comprises its own clock. The number n of processors provides a system redundancy so that a correctly operating system is obtained even with a smaller number of correctly operating processors, for example $(n-1)$. There are also other applications for such a clock system. In such known system a desynchronized state of one of the clocks is indicated, while the other clocks of the system can continue in a mutually synchronized state.

SUMMARY OF THE INVENTION

It is an object of the present invention to provide a self-synchronizing multiple clock system which is composed of simple clocks and in which a feedback is formed between the actual state of the oscillator circuit and the deviation-determining device in order to render the clock system self-synchronizing as well as fault tolerant. The clock system maintains a mutually synchronized state between a majority of the clocks. The object is achieved in that in accordance with the invention each clock comprises, as a part of interconnection, a two-state dividing circuit which is switched over, under the control of a period signal of the local oscillator circuit, at a recurrent series of switching points and which continuously outputs the associated signal value of its "own" clock signal on its output in each state. The deviation-determining device comprises a comparator for comparing the number of clock signals received from other clocks and deviating from its own clock signal with a permissible upper limit which at the most equals entier $\frac{1}{2}(n-1)$ and to generate, in the case of a larger number, a deceleration signal in a first period which directly succeeds a switch-over point but an acceleration signal in a second period which directly preceeds a switch-over point in order to readjust the frequency of the oscillator circuit. Isochronously is to be understood to mean herein the relation pattern in which characteristic phenomena of a first element (so in this case the state changes of the dividing circuit) always occur at corresponding points of the cycle of the second element (so in this case the oscillator circuit). Therefore, the dividing circuit can be set at the same point of the oscillator circuit cycle, but possibly also at another point. The durations of the first and the second periods may be the same, but they may also be different. Thus, for a value $n=4$ the permissible upper limit is 1; for a value $n=5$, the upper limit equals 1 or 2, and so on for higher values of n. The system is also fault tolerant in many cases: a given number of clocks may be completely out of step and will be ignored. The specific differences with respect to and the advantages over the present state of the art will be described hereinafter.

Preferably, upper limit at the most equals entier $\frac{1}{3}(n-1)$. For $n=4$, the permissible upper limit then equals 1, likewise for $n=5$ and 6. For $n=7$, the permissible upper limit then equals 2. It has been found that this more severe requirement provides protection against practically all feasible fault configurations which are limited to a number of clock circuits which does not exceed the upper limit including inter alia interruptions in the output line for the clock signal of the faulty clock.

Preferably, the end of the first period is consecutive with the beginning of the second period. This results in a simple organization and quick synchronization (by way of a large "pull-in" range for the synchronization).

Preferably, between the first period and a directly subsequent second period there is situated a third period, there being provided an error detection circit in a clock for supplying an error signal in third period when the upper limit is exceeded due to another clock. After termination of switch-on phenomena, such error signal clearly indicates that the relevant clock circuit is out of step so that more likely it is faulty.

Preferably, there is provided a deactivation control element for deactivating, under the control of said error signal, the clock thus deemed faulty. A faulty clock circuit can thus be deactivated, subject to the condition that said switch-on phenomena have terminated.

Preferably, said dividing circuit is a two-divider which is controlled in synchronism with the period of the oscillator circuit. This offers a simple implementation.

The oscillator circuit in a preferred embodiment comprises a circuit loop which includes an EXCLUSIVE-OR-gate, a low-pass filter and an oscillator, the dividing circuit being connected to an output of the oscillator while the output of the deviation-determining device is connected to an input of the EXCLUSIVE-OR-gate in order to apply thereto, when the upper limit is exceeded, a first logic value during the first period and a second logic value during the second period, but otherwise the second logic value and the first logic value, respectively. Thus, a simple implementation is achieved, allowing the use of standard components.

In another preferred embodiment, the oscillator circuit comprises an oscillator and a counter which is fed by the oscillator and which counts from a start count state to a maximum count state, a logic circuit is also provided which forms, under the control of an output signal of the deviation-determining device, a hold signal in case of a low count but an acceleration signal in the case of a high count. This is a completely digital solution, so that an arbitrary adjustment accuracy can be achieved.

Preferably, the acceleration signal emulates a maximum count signal. This results in accelerated self-synchronization.

Preferably, for $n=4$ the deviation-determining device comprises a majority decision device for the clock signals of the other clocks and a comparison circuit which receives an output signal of the majority decision device and its own clock signal. The foregoing results in a simple implementation and, moreover, this number of clocks already suffices in many cases.

The present invention also relates to a clock circuit which is intended for use in a multiple redundant clock system which comprises (n−1) external connections for receiving externally formed clock signals, and which also comprises an oscillator circuit, a dividing circuit and a deviation-determining device of the kind described. Such a clock circuit forms an attractive module in which n and the upper limit may be adjustable, if desired.

The invention also relates to a multiprocessor computer system comprising n computer modules, each computer module comprising a clock so that the n clocks constitute a multiple redundant clock system of the kind described. Each computer module also comprising a processor module for the processing of a data word, a reducing encoder which is connected to the processor module in order to form a code symbol from the data word so that the n code symbols formed from a data word form a code word of a symbol error correction code, a memory module which is connected to the reducing encoder in order to store a code symbol per data word, and a data word reconstruction module, the data word reconstruction modules of all computer modules being connected to the relevant computer modules by way of a second interconnection network in order to receive the relevant code symbols of a code word and to reconstruct therefrom a data word for presentation to the processor module of the relevant computer module, the various data processing operations being synchronized by the clock system. A computer system of this kind, but without the present clock system, has already been partly disclosed in U.S. Pat. No. 4,402,045. The clock system is thus also rendered redundant, so that the system is capable of dealing with a failure of the clock section as well as with a failure of the data processing section of a number of modules as long as this number does not exceed the upper limit of the fault tolerance capacity.

BRIEF DESCRIPTION OF THE DRAWINGS

The invention will be described in detail hereinafter with reference to some figures.

FIG. 1 is a simple block diagram of a multiprocessor computer system comprising a multiple redundant clock system.

FIGS. 3 and 4 show the logic expressions for FIG. 2.

FIGS. 5 and 6 show two embodiments of a clock circuit.

FIG. 7 illustrates the content of a read-only memory.

DESCRIPTION OF THE PREFERRED EMBODIMENTS

FIG. 1 is a simple block diagram of a multiprocessor computer system comprising a multiple redundant clock system. The computer system comprises four computer modules. Each computer module comprises a processor module, its own clock, and a data word reconstruction module. There are four processor modules 200-206. Each clock 220-226 applies clock signals to the associated processor. Each clock also applies clock signals to all other clocks, and hence indirectly to the other processor modules. Each processor module outputs its output data to all four data word reconstruction modules 210-216 which together form a data word reconstruction device. In each data word reconstruction module, given data errors can be detected and/or corrected; the correct data is applied to the associated processor in which data processing can take place. A computer system divided into a number of modules has already been disclosed in U.S. Pat. No. 4,402,045 (PHN 9652) in the name of Applicant; therein, a code word consisting of code symbols is formed on the basis of a data word consisting of data symbols. After encoding, each computer module processes only a part of the code word, for example one code symbol. This operation concerns, for example, memory storage, followed by a read operation and regeneration of the code symbol. In order to reconstruct the entire data word for an arithmetic operation, all code symbols are applied to all computer modules. It has been found that the operation can be correctly performed even in the case of complete failure of, for example, one computer module. Such a system can be synchronized by a master clock. In the set-up shown in FIG. 1, the various operations in the various computer modules are synchronzied by the clock system consisting of clocks 220-226. The operation of the data word reconstruction modules can also be synchronized in this manner, but this is not shown. Should one of the computer modules, for example the module comprising blocks 202-212, 222, become defective (data or clock), the other three modules can continue to operate in the usual manner. In accordance with U.S. Pat. No. 4,402,045, the system requires only a two-fold storage capacity in the memory for a four-fold processing capacity in the arithmetic and logic (ALU) unit in comparison with a single-nonredundant processor (in the terminology used, the processor thus also comprises the foreground memory; the background memory and further peripheral apparatus are not considered herein). Similarly, another multiple data processing system (for example, a communication system, a word processing system and the like) can also comprise such a multiple redundant clock system.

PREFERRED EMBODIMENTS OF THE INVENTION

Figure 2:
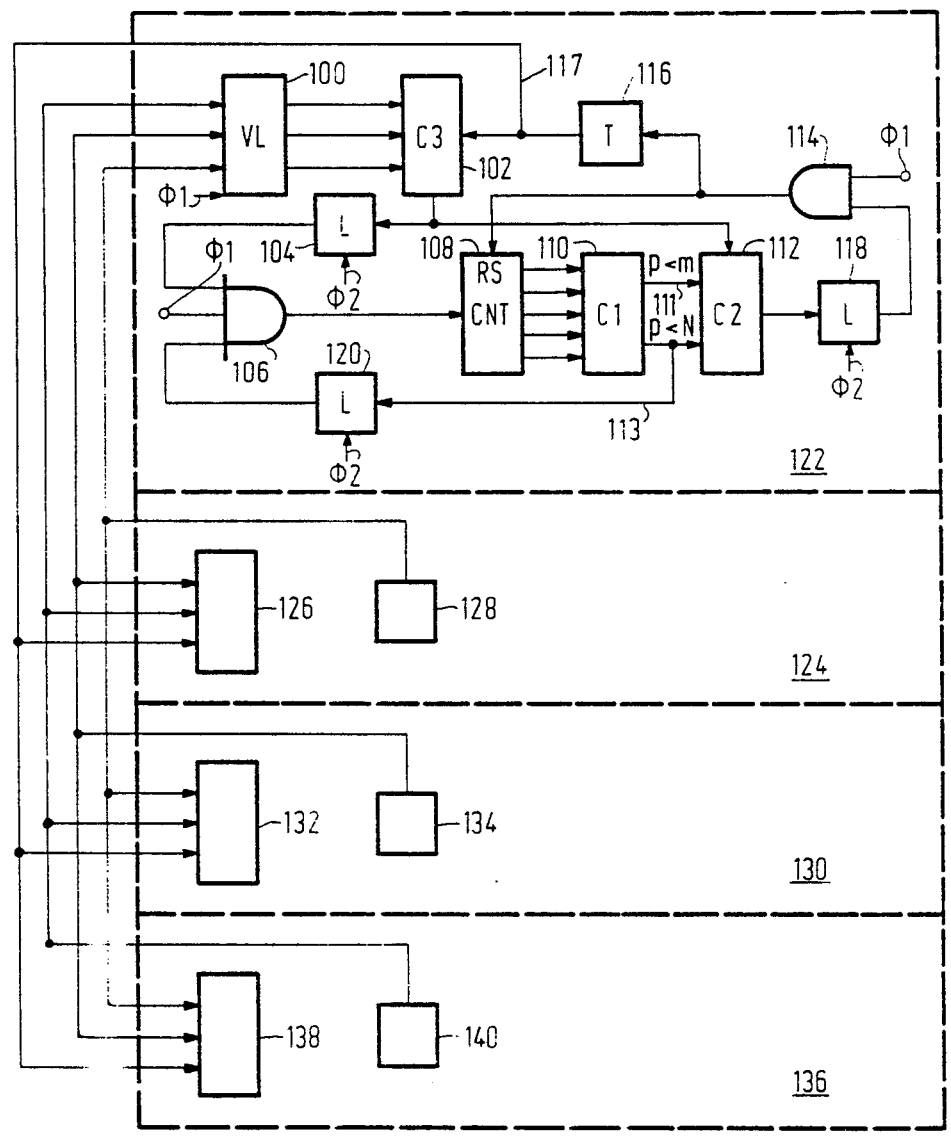
FIG. 2 shows a clock system in accordance with the invention.

FIG. 2 shows a self-synchronizing clock system for four single clocks in accordance with the invention. The number of clocks connected may be arbitrarily large and the degree of redundancy may also be increased. The first single clock is shown in detail in block 122. This clock is driven by an internal oscillator having a frequency which is, for example, from 20 to 100 times higher than the required operating frequency: the latter frequency is formed by the counter 108 which acts as a frequency divider in conjunction with element 116. The oscillator frequency is not subject to very severe constraints. The oscillator may be, for example, an oscillator which is adjusted by means of an external RC-network. This oscillator alternately supplies an odd clock pulse $\phi 1$ and an even clock pulse $\phi 2$, thus synchronizing the operation of the logic circuits 106 and 114 and the latch circuits 100, 104, 118 and 120. The relevent clock signals can also be formed by positive and negative edges, respectively, of a single clock signal.

Each clock unit 122, 124, 130, 136 produces an external clock signal by way of the relevant toggle flip-flop 116, 128, 134, 140, respectively. The clock unit 122 receives the external clock signals of the clock units 124, 130, 136 in the multiple latch circuit 100. The further clock units comprise corresponding multiple latch circuits 126, 132, 138. Counter 108, which is in this case formed as a five-bit counter, counts the clock pulses $\phi 1$ subject to the condition that the latch circuits 104 and 120 both contain a "1", because the AND-gate 106 is then conductive. In this respect reference is already made to FIGS. 3 and 4 which show the logic relations on which the operation of counter 108, majority circuit 102 and toggle flip-flop 116 is based. For FIG. 4 an arbitrary number of clock units is assumed to be present. When counter 108 has not (yet) reached its maximum count, $p < N$, the latch circuit 120 receives a logic "1" which is stored under the control of an even clock pulse. When counter 108 has reached its maximum count, latch circuit 120 receives a logic "0" for storage. In that case, however, logic circuit 112 applies a "1" to latch circuit 118, which "1" is stored under the control of an even clock pulse. Under the control of the next odd clock pulse, AND-gate 114 then outputs a "1". As a result, counter 108 is reset to its starting state and the state of toggle flip-flop 116 changes. The value of the "own" clock signal on line 117 then changes.

If the number of other clock units supplying an external signal different from that from clock unit 122 is not excessively large, latch circuit 104 receives a "1". For redundancy degree or error tolerance degree F, this means at the most F of the other clock circuits are allowed to supply a signal which deviates from the "own" clock. For an extremely high reliability, notably when exclusively digital elements are used (as in FIGS. 2 and 6), the number n of clock units must be larger than or equal to $3F+1$. Usually a smaller number of clock circuits, such as is given by $n \geq 2F+1$, suffices notably for the solution shown in FIG. 5 which involves a phase-locked loop. The detection of the number of signals deviating from the "own" clock is performed in logic circuit 102. When both latch circuits 104 and 120 have stored a "one" (under the control of an even clock pulse), AND-gate 106 conducts the odd clock pulses until this situation is terminated; the counter 108 thus each time reaches it maximum count and is subsequently reset to zero. In the case of a ring counter, resetting would even be superfluous. The second line of FIG. 3 is thus implemented.

The output of logic circuit 102 is also applied to logic circuit 112. When circuit 102 outputs a "0" (too many other clocks deviate), gate 106 is subsequently blocked. Logic circuit 112 now, implements the first line and the first part (up to or) of the third line of FIG. 3. When the signal on line 113 indicates that counter 108 is in a low count state ($p < m$, for example, $p < N/2$), nothing happens so that the incrementation of counter 108 is thereupon blocked (first line of FIG. 3). When the signal on line 113 indicates that counter 108 is in a high count state (for example, $p \geq N/2$), the maximum count state of this counter 108 is directly emulated (third line, first part of FIG. 3). The indications do and od in FIG. 3 indicate that this procedure is cyclically repeated; the blocks indicate chaining of the expressions; the logic AND-function has priority over the logic "OR"-function. In the four-fold system described, one of the clock units may have an arbitrary synchronization condition: in that case self-synchronizing always occurs. This holds good regardless of the output signal of this one deviating clock unit. Notably the following situations are solved:

(a) the deviating clock unit outputs a static signal which, however, is received in a different manner by the various latch circuits 100, 126, 132, 138 (in some as "0" and in some as a "1").

(b) an arbitrary noise signal is superposed on the signal of the deviating clock unit, so that the counter of this clock unit may be in an arbitrary state at any instant. In the figure equal intervals are chosen for a "high" and a "low" count state. The intervals need not be equal. It is alternatively possible to separate these intervals by a third interval, for example in that the condition in the first line is: $p < N/4$, in the third line is $p \geq 3N/4$, and in that an additional line is inserted: $\sim D\ (s) > F$ and $N/4 \leq p < 3N/4 \rightarrow ERR$.

Thus, in that case a fault indication occurs. An additional restriction can, for example, be imparted to this fault indication, i.e. the start has to have taken place a given period of time previously: until that instant the operation "skip" is implemented. The latter period of time is determined simply by means of a monostable element which blocks the AND-gate which serves to supply the signal ERR. The condition of the count state is decoded 110 by means of a decoder. The signal ERR can control a "clear mode" during which the output signals "clock" and "data" of the relevant computer module (FIG. 1) are ignored by the other computer modules. Each module which detects a deviating signal from another module treats the other module as being faulty. This can be achieved by means of a switch (not shown for the sake of simplicity) which isolates the clock signal of the faulty module from the detecting module and replaces it by the clock signal of the own clock. Any changes in the symbol correction code can be performed as described in U.S. Pat. No. 4,512,020. Input signals having the value "terminated by a high impedance" are then treated as "0" in the data word reconstruction module in order that they will be ignored. Alternatively, such a switch-off mechanism may be omitted, but in that case the decoding in the data word reconstruction modules is controlled selectively.

The expressions of FIG. 4 correspond to those of FIG. 3 but serve notably for a situation involving four cooperating clocks. "S" represents the "own" clock signal. "V" represents the majority of the other clock signals. FIGS. 3 and 4 otherwise correspond.

FIG. 5 shows an embodiment of a clock utilizing an oscillator included in a so-called phase-locked loop (PLL). Such modules are commercially available and comprise the components indicated with rectangle 300 which is drawn in broken lines: an EXCLUSIVE-OR-gate 302, a low-pass filter 304 and an oscillator (VCO) 306 whose frequency is controlled by the output signal of the low-pass filter. The time constant of the low-pass filter (inverse limit frequency) is large with respect to the period of the voltage-controlled oscillator 306, for example 10 times larger. The output signal of the oscillator 306 is fed back to the input of the EXCLUSIVE-OR-gate 302 and, moreover, to the input of the T-flip-flop 308. The latter acts as a two-divider because it changes its state each time a positive-going signal edge is received on its input. The clock shown is suitable for use in a four-fold clock system which is not susceptible to the failure of one of the four clocks. To this end, the inputs 312 are connected (via an interconnection not shown) to the clock outputs of the other clocks. Thus, when these other clocks have a construction as shown in FIG. 5, each of these outputs the output of the flip-flop of the relevant other clock which corresponds to T-flip-flop 308. The output of flip-flop 308, or alternatively directly the output of oscillator 306, can be used as a clock signal for a local station which is thus synchronized, provided that at least two relevant clock signals are received from other clocks on inputs 312. Element 310 is a deviation-determining device which is constructed, for example as a programmable logic array (PLA) or as a random access programmable read-only memory (PROM). The operation thereof will be described later; modules of this kind are commercially available. Instead of element 308, use can be made of a four-divider, the outputs of both states together giving an indication that the third period is being completed; these two are then applied together to element 310. Element 308 may, for example, also divide by a different factor, for example by three. If it is necessary to form a symmetrical clock pulse, it is often also necessary to insert a low-pass filter or bandpass filter in the output line of divider 308 for the removal of higher harmonics.

Figures 6, 7:
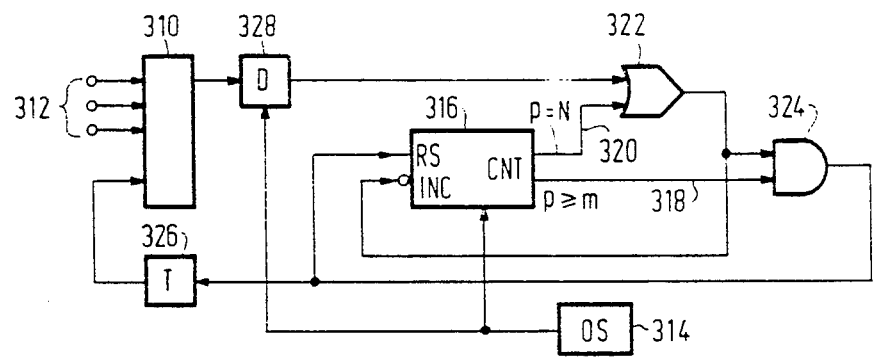

FIG. 6 shows an embodiment of a clock utilizing a counter; this circuit represents mainly an improvement of a circuit of the kind shown in FIG. 2. Oscillator 314 serves to render the operation of the circuit time-discrete. In contrast therewith the circuit shown in FIG. 5 operates continuously, because the signals therein can in principle change at arbitrary instants. Oscillator 314 applies clock signals to counter 316 which may be, for example, a conventional four-bit counter. This counter has a maximum count output 320, for example an output for a ripple carry signal. Output 320 is connected, via OR-gate 322, to an input INC for an inverted enable signal; when the counter has reached its maximum count, therefore, further clock signals are ineffective. The counter also has an output 318 which outputs a high signal when the count state exceeds a given value m. In the fourbit counter described, N has the value 15 and m, for example has the value 8, so that the output signal of a bit state can be used. The output of OR-gate 322 is combined with output 318 of counter 316 in AND-gate 324. The output signal of AND-gate 324 is returned to the reset input of counter 316 so that the latter directly assumes its zero state again when its maximum count is reached. The output of gate 324 is also connected to a two-divider 326 whose operation corresponds to two-divider 308 of FIG. 5. Data flip-flop 328 which temporarily stores the output signal of deviation-determining device 310 under the control of a signal from oscillator 314 is connected to the output of deviation-determining device 310. Finally, the output of the data flip-flop 328 is applied to the OR-gate 322.

FIG. 7 shows the data content of deviation-determining device 310 constructed as a PROM memory and adapted for a six-fold clock system. The translation to a programmable logic array has thus become elementary. The signal S represents the "own" clock signal (on the output of elements 308 and 326 in FIGS. 5 and 6 respectively). The signals X1, X2, X3, X4, X5 are the corresponding signals of the other five clocks. The signal D is the output signal of the deviation-determining device. The columns D, S at the left-hand side represents the situation of S=0 if no more than two clock circuits may deviate; this number two is, therefore, the redundancy degree. The output signal D is formed as the majority signal between the signals X1, X2, X3, X4, X5. The columns D, S at the right-hand side represent the situation for S=1; the signal D is then formed as the inverse value of the majority signal between the signals X1, X2, X3, X4, X5. The column D1 at the left-hand side represents the situation where the system is designed for a fault tolerance degree F=1. D1=0 only if a qualified majority (at least four) of the signals X1 . . . X5 has the value 0. The limits for this qualified majority as a function of the number of clock circuits and the value of the redundancy degree have already been described. In case of a four-fold clock system, only the row numbers 4p-1, 4p-2 and taken with p=1, . . . 2 . . . 8. Each time X4≠X5, and X4, X5 are ignored. Corresponding considerations are applicable to eight-fold and even larger clock systems. A programmable read-only memory of the kind described can be used in a system comprising a number of clocks which is smaller than the number of inputs of the PROM memory. The own clock signal is then applied to the free inputs. In the circuit shown in FIG. 6 it is also possible to include the EXCLUSIVE-OR-gate 302 in the function of the read-only memory; the delay introduced by the PROM memory as an active phenomenon in the circuit is then avoided. Sometimes the operation is thus improved. The output of the voltage-controlled oscillator is then added as an additional address line.

The differences with respect to the described state of the art notably concern the following:

(a) the bistable element wherefrom the local clock signal is derived is situated at the output side of the phase-coupled loop or counter, (b) the comparison between the local clock signal and the clock signals of the other modules takes place at the input side of the circuit in the deviation-determining device.

Consequently, in the case of n stuck-at-circuits (constant output signal), the present circuit could usually cope with (2F+1) modules; this is because the counter/phase-locked loops of the remaining operative stations would continue counting in an unimpeded manner. Furthermore, notable in the case of the arbitrary noise signal on an output of one of the clocks in the present circuit, such a noise signal would be removed by filtering by the low-pass filter of the phase-locked loop; consequently, this signal will never reach the relevant bistable circuit.

The above difference (b) simplifies the deviation-determining device, because the use of a singular majority-decision device suffices. Moreover, no or hardly any compensation will be required for signal delays in the deviation-determining device, because the comparison takes place at the input side thereof.

What is claimed is:

1. A multiple redundant clock system comprising a plurality of n≧4 mutually synchronizing clock circuits, each clock circuit comprising:
 (a) n−1 external connections for receiving n−1 externally formed clock signals;
 (b) a phase lock loop comprising:
  (i) a voltage controlled oscillator;
  (ii) a dividing circuit connected to frequency divide signals from said voltage controlled oscillator; and
  (iii) a low pass filter for supplying a control signal to a control input of said oscillator;
 (c) a deviation determining device connected to receive said n−1 externally formed clock signals and an output signal of said dividing circuit;
 (d) an exclusive OR-gate for receiving said signals from said oscillator, and a signal from said deviation determining device and having an output at said low-pass filter;

said deviation determining device providing to said exclusive OR-gate a first logic signal, during a first period, indicating that a maximum number of said external clock signals deviate from the dividing circuit output signal frequency, and during a second period supplying to said exclusive OR-gate a second logic signal, whereby a frequency deceleration and frequency acceleration signal are supplied to said oscillator control input during said first and second periods respectively.

2. A multiple redundant clock system as claimed in claim 1, wherein, when a number of said external clock signals deviating from the dividing circuit output signal frequency is less than said maximum number, said deviation determining device provides said second logic signal during said first period and said first logic signal during said second period.

3. A multiple redundant clock system comprising:
(a) a number n of mutually synchronizing clock circuits, where n is an integer greater than or equal to four, each clock circuit comprising:
  (i) an oscillator circuit having an output at which a periodic signal is provided, said periodic signal comprising first and second recurrent switchover points defining recurrent intervals of time, each interval of time comprising a first subinterval of time directly succeeding the respective first switchover point and a second subinterval of time directly preceding the respective second switchover points;
  (ii) a two-state dividing circuit including:
    (A) a control input coupled to receive the periodic signal of the oscillator circuit;
    (B) an output at which a square-wave clock signal having alternating first and second logic values is provided;
  (iii) a deviation-determining device including:
    (A) a first input for receiving the clock signal from its own two-state dividing circuit;
    (B) a plurality of further inputs for receiving clock signals from the other clock circuits, said other clock signals having respective alternating first and second logic values;
    (C) means for determining whether a predetermined permissible upper limit number is exceeded by a first number of said other clock signals that have instantaneous logic values different from an instantaneous logic value provided by said own two-state dividing circuit;
    (D) means for generating one of a deceleration signal and an acceleration signal, said deceleration signal being generated if said means for determining determines, during one of said first subintervals of time, that said first number exceeds said permissible upper limit number; said acceleration signal being generated if said means for determining determines during one of said second subintervals of time, that said first number exceeds said permissible upper limit number; said deceleration and acceleration signal generating means having an output, coupled to the oscillator circuit, at which said deceleration and acceleration signals are provided so as to alter a duration of at least one interval of time in the periodic signal;
(b) an interconnection network for coupling the square-wave clock signal of each clock circuit to each of the other clock circuits.

4. The system of claim 3 wherein the oscillator circuit comprises a counter having an output at which the periodic signal is provided and an input coupled to the output of the generating means, the counter operating as a frequency divider and being responsive to the acceleration and deceleration signals.

5. The system of claim 4 wherein the counter is incremented when no acceleration or deceleration signal is present, is stopped in response to the deceleration signal, and is reset to zero in response to the acceleration signal, whereby a reset to zero operation emulates a maximum count of the counter.

6. The system of claim 3 wherein each interval of time consists of only said first and second subintervals of time, whereby an end of each said first subinterval of time coincides with a beginning of a subsequent one of said second subintervals of time.

7. A multiple redundant clock system as claimed in claim 3 wherein each said interval of time further comprises a third subinterval of time which separates respective first and second subintervals of time, and wherein said deviation determining device comprises an error detection circuit for supplying an error signal during said third subinterval of time, when said permissible upper limit number is exceeded, which identifies one of said further inputs which results in said permissible upper limit number being exceeded.

8. A multiple redundant clock system as claimed in claim 7 wherein said deviation determining device further comprises a deactivation control element for deactivating, under the control of said error signal, said one of said further inputs.

9. The system as claimed in claim 3 wherein:
(a) n=4;
(b) the means for determining comprises:
  (i) a majority decision device coupled to receive the clock signals of the other clock circuits;
  (ii) a comparison circuit which receives an output signal of the majority decision device and receives the square-wave clock signal from the dividing circuit, and has an output at said deceleration and acceleration signal generating means.

10. The clock system of claim 3 wherein said permissible upper limit number is an integer which is not greater than $(\frac{1}{2})(n-1)$.

11. A multiple redundant clock system as claimed in claim 3, wherein said permissible upper limit number is an integer which is not greater than $(\frac{1}{2})(n-1)$.

* * * * *